(12) United States Patent
Yoshioka et al.

(10) Patent No.: US 10,039,190 B2
(45) Date of Patent: Jul. 31, 2018

(54) COIL COMPONENT

(71) Applicant: Murata Manufacturing Co., Ltd., Kyoto (JP)

(72) Inventors: Yoshimasa Yoshioka, Nagaokakyo (JP); Kenji Nishiyama, Nagaokakyo (JP); Daisuke Takagi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/195,134

(22) Filed: Jun. 28, 2016

(65) Prior Publication Data

US 2017/0006704 A1 Jan. 5, 2017

(30) Foreign Application Priority Data

Jul. 3, 2015 (JP) ................... 2015-134348

(51) Int. Cl.
*H05K 1/18* (2006.01)
*H01F 27/28* (2006.01)
*H01F 27/24* (2006.01)
*H01F 3/08* (2006.01)
*H01F 5/00* (2006.01)
(Continued)

(52) U.S. Cl.
CPC ............... *H05K 1/18* (2013.01); *G07D 7/164* (2013.01); *H01F 3/08* (2013.01); *H01F 5/003* (2013.01); *H01F 27/292* (2013.01); *H05K 2201/1003* (2013.01)

(58) Field of Classification Search
CPC . G01B 7/06; G01B 7/10; G01B 11/06; G01B 7/107; G07D 7/164
See application file for complete search history.

(56) References Cited

U.S. PATENT DOCUMENTS 6,782,986 B2 * 8/2004 Toda ..................... G07D 7/16
194/206
8,610,441 B2 * 12/2013 Dahler ................. G01B 7/107
324/671
(Continued)

FOREIGN PATENT DOCUMENTS

JP 2000-329510 A 11/2000
JP 3216627 B2 10/2001
(Continued)

OTHER PUBLICATIONS

An Office Action issued by the Korean Patent Office dated Sep. 27, 2017, which corresponds to Korean Patent Application No. 10-2016-0079314 and is related to U.S. Appl. No. 15/195,134; with English language translation.
(Continued)

*Primary Examiner* — Hoa C Nguyen
*Assistant Examiner* — Amol Patel
(74) *Attorney, Agent, or Firm* — Studebaker & Brackett PC (57) ABSTRACT

A coil component includes a mounting surface that is a side mounted on a mounting board and a detecting surface that is a side generating a magnetic field to detect a distance from a detected conductor. The coil component has a coil conductor formed into a spiral shape, and a magnetic resin disposed on the mounting surface side of the coil conductor without being disposed on the detecting surface side of the coil conductor.

5 Claims, 10 Drawing Sheets

(51) Int. Cl.
 *G07D 7/164* (2016.01)
 *H01F 27/29* (2006.01)

(56) References Cited

U.S. PATENT DOCUMENTS

| | | | | |
|---|---|---|---|---|
| 2002/0110396 | A1* | 8/2002 | Ueoka | G07D 7/164 |
| | | | | 400/56 |
| 2008/0189968 | A1* | 8/2008 | Schletti | G01B 7/107 |
| | | | | 33/501.4 |
| 2014/0020940 | A1* | 1/2014 | Mano | H05K 1/165 |
| | | | | 174/258 |
| 2014/0176283 | A1 | 6/2014 | Yang et al. | |
| 2014/0265612 | A1* | 9/2014 | Choi | H01F 27/365 |
| | | | | 307/104 |
| 2016/0155557 | A1* | 6/2016 | Park | H01F 17/0033 |
| | | | | 336/83 |
| 2016/0218691 | A1* | 7/2016 | Park | H01F 27/2804 |

FOREIGN PATENT DOCUMENTS

| | | |
|---|---|---|
| JP | 2010-056996 A | 3/2010 |
| JP | 2013-153184 A | 8/2013 |
| JP | 2014-127718 A | 7/2014 |
| KR | 2014-0083577 A | 7/2014 |
| WO | 01/036904 A1 | 5/2001 |

OTHER PUBLICATIONS

An Office Action, "Notification of Reasons for Refusal," issued by the Japanese Patent Office dated Mar. 6, 2018, which corresponds to Japanese Patent Application No. 2015-134348 and is related to U.S. Appl. No. 15/195,134; with English translation.

An Office Action; "Notification of Reasons for Refusal," issued by the Korean Intellectual Property Office dated Apr. 13, 2018, which corresponds to Korean Patent Application No. 10-2016-0079314 and is related to U.S. Appl. No. 15/195,134.

* cited by examiner

COIL COMPONENT

CROSS REFERENCE TO RELATED APPLICATIONS

This application claims benefit of priority to Japanese Patent Application 2015-134348 filed Jul. 3, 2015, the entire content of which is incorporated herein by reference.

TECHNICAL FIELD

The present disclosure relates to a coil component.

BACKGROUND

Conventional coil components include a coil component described in WO 01/036904 A1. The coil component is used for a thickness detection apparatus detecting a thickness of a paper sheet such as paper money. The coil component is disposed on a portion of a printed circuit board making up a circuit of a detection apparatus.

A roller for detecting a thickness of a paper sheet as a displacement amount is disposed to face the coil component and a high-frequency magnetic field is generated from the coil component to detect an eddy-current loss caused by bringing the coil component closer to the roller. As a result, a displacement amount of a roller is detected to detect the thickness of the paper sheet.

SUMMARY

Problem to be Solved by the Disclosure

It was found out that the following problem exists when the conventional coil component was actually manufactured and used.

When wiring or another electronic component is disposed in the vicinity of a coil component on a printed circuit board, the magnetic flux of the coil component magnetically couples to the wiring or the other electronic component and a desired resonance operation cannot be acquired. Therefore, wiring and an electronic component cannot be disposed in the vicinity of the coil component and the board disposed with the coil component cannot be reduced in size.

Therefore, a problem to be solved by the present disclosure is to provide a coil component capable of acquiring a desired resonance operation and enabling a reduction in size of a board disposed with the coil component.

Solutions to the Problems

To solve the problem, a coil component of the present disclosure is a coil component having amounting surface that is side mounted on a mounting board and a detecting surface that is a side generating a magnetic field to detect a distance from a detected conductor, comprising:
   a coil conductor formed into a spiral shape; and
   a magnetic resin disposed on the mounting surface side of the coil conductor without being disposed on the detecting surface side of the coil conductor.

According to the coil component of the present disclosure, since the magnetic resin is disposed on the mounting surface side of the coil conductor, the magnetic resin can suppress a magnetic flux leakage from the mounting surface of the coil component. Therefore, when the mounting surface of the coil component is mounted on the mounting board, the magnetic flux leakage to the mounting board side of the coil component can be suppressed to acquire a desired inductance. Additionally, by suppressing the magnetic flux leakage to the mounting board side of the coil component, the magnetic coupling to wiring and another electronic component disposed on the mounting board can be suppressed to acquire a desired resonance operation. As a result, wiring and an electronic component can be arranged in the vicinity of the coil component so as to achieve a reduction in size of the mounting board on which the coil component is mounted.

On the other hand, since the magnetic resin is not disposed on the detecting surface side of the coil conductor, the magnetic resin does not prevent the generation of the magnetic field from the detecting surface of the coil component. Therefore, when the detected conductor is placed on the detecting surface of the coil component, the magnetic resin does not prevent the generation of the magnetic field toward the detected conductor of the coil component and does not reduce the sensitivity of detection of distance from the detected conductor by the coil component.

In an embodiment of the coil component, the magnetic resin is disposed inside an inner surface of the coil conductor.

According to the embodiment, since the magnetic resin is disposed inside the inner surface of the coil conductor, the magnetic resin makes up an inner magnetic path of the coil conductor. This enables an increase in density of the magnetic flux radiated from the coil component, an improvement in detection sensitivity of the coil component, and a reduction in size of the coil component.

In an embodiment of the coil component, the magnetic resin disposed on the mounting surface side of the coil conductor covers the inside of the inner surface of the coil conductor when viewed in an axial direction of the coil conductor, and is larger than the inner surface of the coil conductor.

According to the embodiment, the magnetic resin disposed on the mounting surface side of the coil conductor covers the inside of the inner surface of the coil conductor when viewed in the axial direction of the coil conductor, and is larger than the inner surface of the coil conductor. As a result, the magnetic flux leakage from the mounting surface of the coil component can further be suppressed.

In an embodiment of the coil component, the magnetic resin disposed on the mounting surface side of the coil conductor covers the coil conductor when viewed in the axial direction of the coil conductor, and is larger than an outer surface of the coil conductor.

According to the embodiment, the magnetic resin disposed on the mounting surface side of the coil conductor covers the coil conductor when viewed in the axial direction of the coil conductor, and is larger than the outer surface of the coil conductor. As a result, the magnetic flux leakage from the mounting surface of the coil component can further be suppressed.

Effect of the Disclosure

According to the coil component of the present disclosure, since the magnetic resin is disposed on the mounting surface side of the coil conductor without being disposed on the detecting surface side of the coil conductor, a desired resonance operation can be acquired and the mounting board disposed with the coil component can be reduced in size.

DETAILED DESCRIPTION

The present disclosure will now be described in detail with shown embodiments.

First Embodiment

Figure 1:
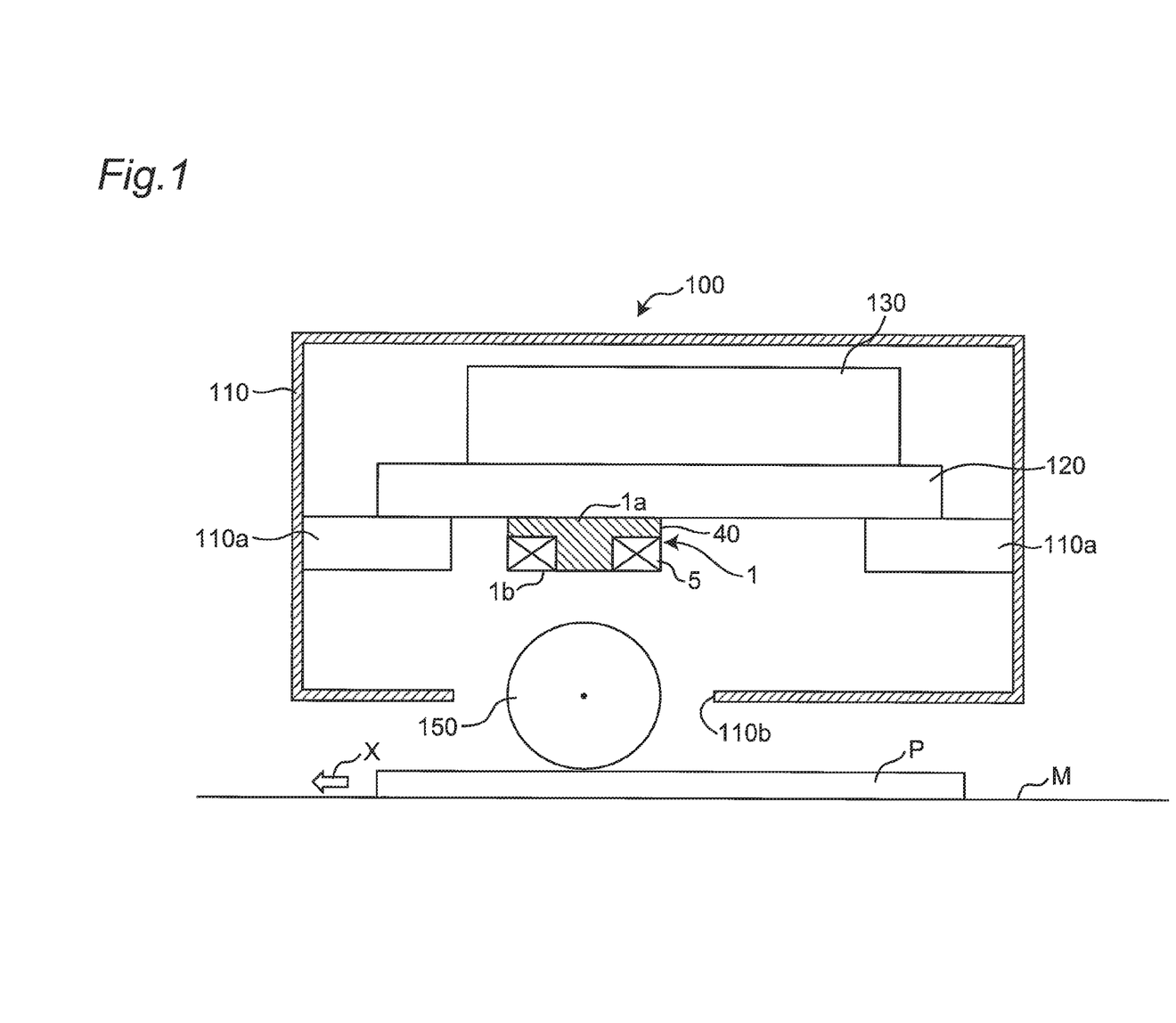
FIG. 1 is a simplified configuration diagram of a first embodiment of a thickness detection apparatus including a coil component of the present disclosure.

FIG. 1 is a simplified configuration diagram of a first embodiment of a thickness detection apparatus including a coil component of the present disclosure. As shown in FIG. 1, a thickness detection apparatus 100 is incorporated into an ATM (automatic teller machine), for example, and detects thickness of paper money. The thickness detection apparatus 100 is disposed above a conveyance path M to detect a thickness of a paper sheet P conveyed in an X direction of the conveyance path M.

The thickness detection apparatus 100 has a casing 110 as well as a mounting board 120, a coil component 1, and a thickness detection circuit 130 disposed in the casing 110, and a roller 150 disposed in an opening portion 110b on the conveyance path M side of the casing 110.

The mounting board 120 is attached via an attaching portion 110a to the inside of the casing 110. The coil component 1 is attached to a surface of the mounting board 120 on the conveyance path M side. The thickness detection circuit 130 is attached to a surface of the mounting board 120 on the side opposite to the conveyance path M. The roller 150 is attached to the casing 110 such that the roller 150 freely rotates and freely advances and retracts from the opening portion 31b. The roller 150 is disposed to face the coil component 1 and freely moves close to and away from the coil component 1.

The roller 150 is rotated while being in contact with the paper sheet P and is displaced in a direction of the coil component 1 depending on the thickness of the paper sheet P. Therefore, the roller 150 detects the thickness of the paper sheet P as a displacement amount. A high frequency signal is applied to coil component 1 to generate a high-frequency magnetic field. The roller 150 is made of a conductor and generates an eddy current due to the magnetic field generated from the coil component 1.

Figure 2:
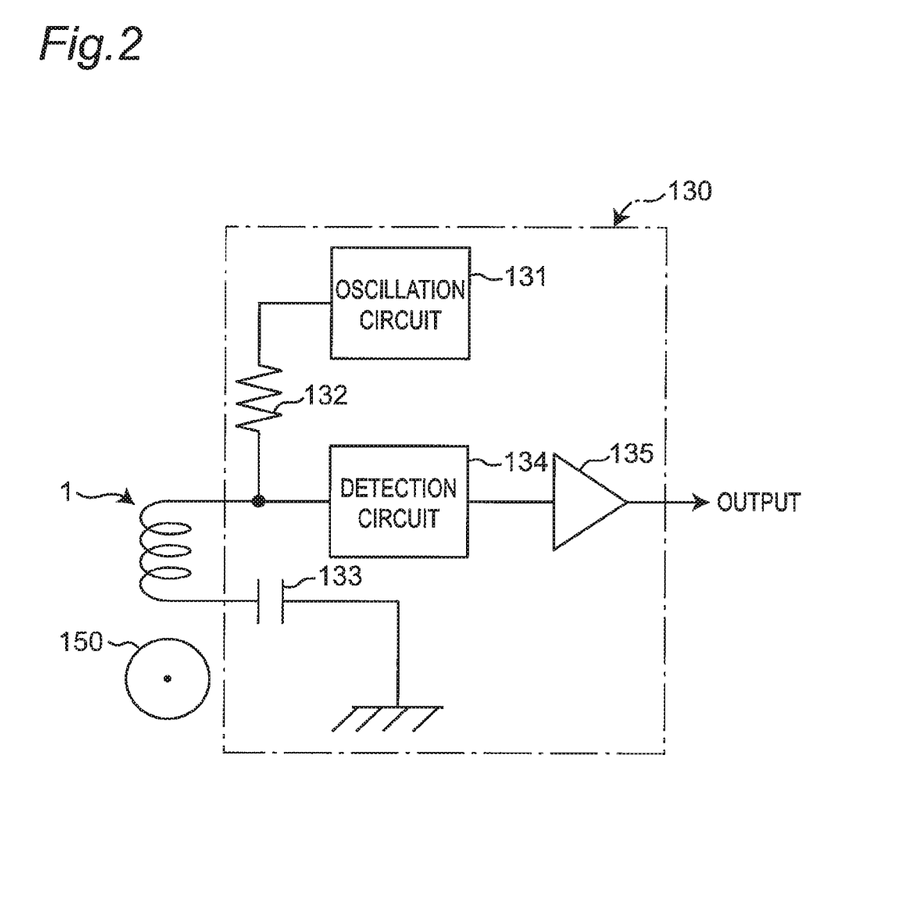
FIG. 2 is a circuit diagram of a thickness detection circuit.

As shown in FIG. 2, the thickness detection circuit 130 is a circuit electrically detecting the thickness of the paper sheet P and is made up of an oscillation circuit 131, a resistor 132, a capacitor 133, a detection circuit 134, and an amplification circuit 135. The oscillation circuit 131 outputs a high frequency signal through the resistor 132. One end of the coil component 1 (coil conductor) is connected through the resistor 132 to the oscillation circuit 131 and the other coil component 1 (coil conductor) is grounded through the capacitor 133.

The detection circuit 134 is a circuit extracting a direct current signal corresponding to the amplitude of the high frequency signal from the oscillation circuit 131. This direct current signal is a signal proportional to a distance between the roller 150 described later and the coil component 1 (the thickness of the paper sheet P). The amplification circuit 135 amplifies a direct current signal input by the detection circuit 134. An output signal of the amplification circuit 135 corresponds to the thickness of the paper sheet P as a thickness detection result.

An operation of the thickness detection apparatus 100 will be described.

When the oscillation circuit 131 is driven, the oscillation circuit 131 supplies a high frequency signal through the resistor 132 to the coil component 1. As a result, a high-frequency current is applied to the coil component 1 and a high-frequency magnetic field is generated around the coil component 1.

When the paper sheet P is conveyed in the X direction in such a state, the roller 150 is rotated while being in contact with a surface of the paper sheet P, and is displaced in the direction of the coil component 1 depending on a thickness of the paper sheet P.

When the roller 150 is displaced in the direction toward the coil component 1, an eddy-current loss associated with the high-frequency magnetic field from the coil component 1 becomes larger and the amplitude of the high frequency signal from the oscillation circuit 131 therefore becomes smaller.

On the other hand, when the roller 150 is displaced in the direction away from the coil component 1, an eddy-current loss associated with the high-frequency magnetic field from the coil component 1 becomes smaller and the amplitude of the high frequency signal from the oscillation circuit 131 therefore becomes larger.

As described above, the distance between roller 150 and the coil component 1 is proportional to the amplitude of the high frequency signal from the oscillation circuit 131. Therefore, since the distance between the roller 150 and the coil component 1 is proportional to the thickness of the paper sheet P, the amplitude of the high frequency signal from the oscillation circuit 131 is proportional to the thickness of the paper sheet P.

The high frequency signal from the oscillation circuit 131 is detected by the detection circuit 134. Thus, the detection circuit 134 outputs a direct current signal corresponding to the amplitude of the high frequency signal to the amplification circuit 135. As a result, the direct current signal is amplified by the amplification circuit 135. The output signal of the amplification circuit 135 is a signal corresponding to the thickness of the paper sheet P.

Figure 3:
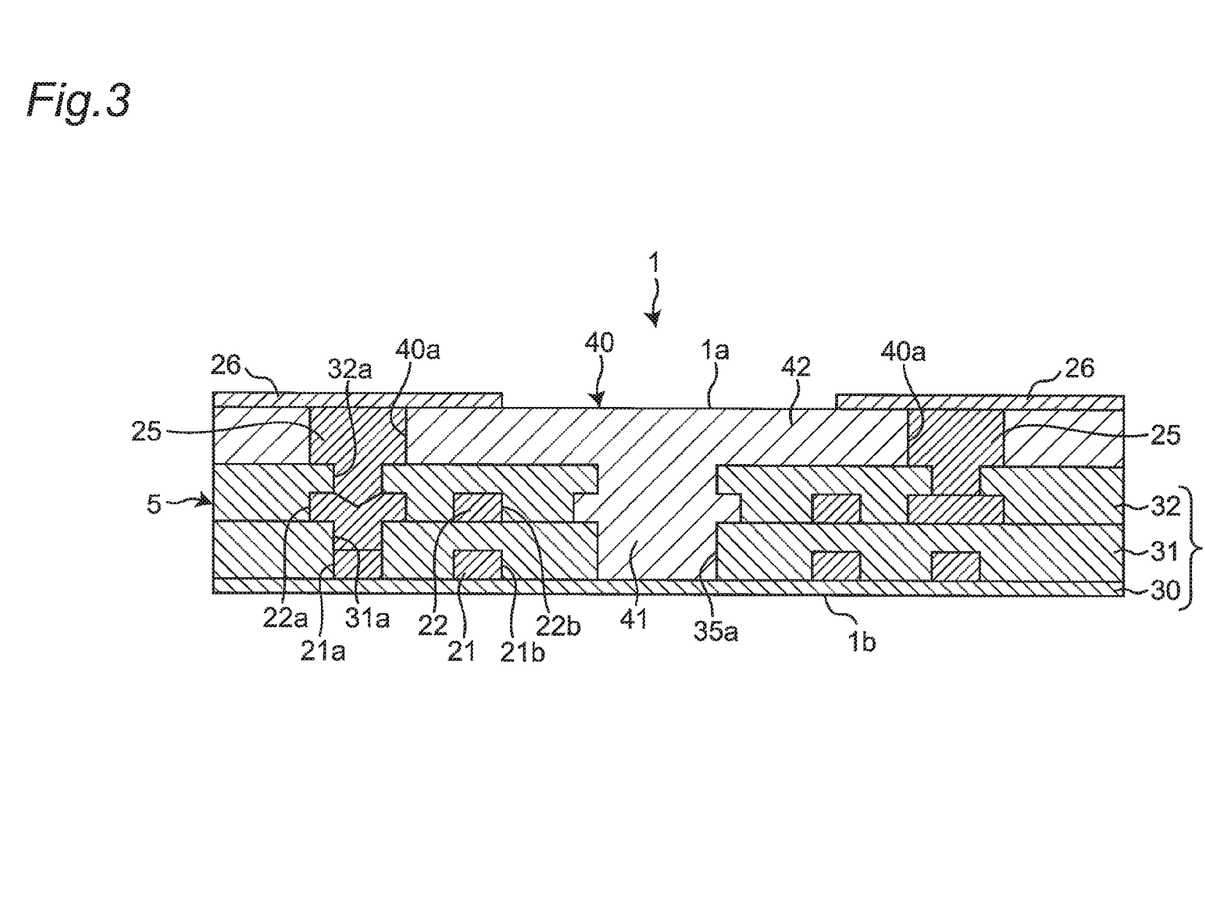
FIG. 3 is a cross-sectional view of a first embodiment of the coil component.

FIG. 3 is a cross-sectional view of a first embodiment of the coil component 1. As shown in FIGS. 1 and 3, the coil component 1 includes a mounting surface 1a that is a side mounted on the mounting board 120 and a detecting surface 1b that is a side generating a magnetic field to detect a distance from the roller 150 (an example of a detected conductor).

The coil component 1 has a coil substrate 5 and a magnetic resin 40 partially covering the coil substrate 5. The coil substrate 5 has two layers of coil conductors 21, 22 and an insulation resin body 35 covering the two layers of the coil conductors 21, 22.

The first and second coil conductors 21, 22 are arranged in order from a lower layer to an upper layer. The first and second coil conductors 21, 22 are each formed into a plane spiral shape. The first and second coil conductors 21, 22 are made of low-resistance metal, for example, Cu, Ag, or Au. Preferably, low-resistance and narrow-pitch coil conductors can be formed by using Cu plating formed by a semi-additive process.

The insulation resin body 35 has a base insulation resin 30 and first and second insulation resins 31, 32. The base insulation resin 30 and the first and second insulation resins 31, 32 are arranged in order from a lower layer to an upper layer. The material of the insulation resins 30 to 32 is, for example, a single material that is an organic insulation material made of epoxy-based resin, bismaleimide, liquid crystal polymer, polyimide, etc., or is an insulation material comprising a combination with an inorganic filler material such as a silica filler and an organic filler made of a rubber material. Preferably, all the insulation resins 30 to 32 are made of the same material. In this embodiment, all the insulation resins 30 to 32 are made of an epoxy resin containing a silica filler.

The first coil conductor 21 is laminated on the base insulation resin 30. The first insulation resin 31 is laminated on the first coil conductor 21 to cover the first coil conductor 21. The second coil conductor 22 is laminated on the first insulation resin 31. The second insulation resin 32 is laminated on the second coil conductor 22 to cover the second coil conductor 22. The second coil conductor 22 is connected to the first coil conductor 21 through a via hole (not shown) disposed in the first insulation resin 31.

Outer surfaces 21a, 22a and inner surfaces 21b, 22b of the first and second coil conductors 21, 22 are covered with the insulation resin body 35. The insulation resin body 35 has a concave portion 35a centering on the same axis of the first and second coil conductors 21, 22. The concave portion 35a is made up of hole portions of the first and second insulation resins 31, 32.

The magnetic resin 40 is disposed on the mounting surface 1a side of the first and second coil conductors 21, 22 while not being disposed on the detecting surface 1b side of the first and second coil conductors 21, 22. The magnetic resin 40 is disposed on the inside (the concave portion 35a) of the inner surfaces 21b, 22b of the first and second coil conductors 21, 22.

Therefore, the magnetic resin 40 has an inner portion 41 disposed on the concave portion 35a of the insulation resin body 35 and an end portion 42 disposed on an end surface of the insulation resin body 35 on the mounting surface 1a side. The inner portion 41 makes up an inner magnetic path of the coil component 1 and the end portion 42 makes up an outer magnetic path of the coil component 1. The end portion 42 covers the first and second coil conductors 21, 22 when viewed in the axial direction of the first and second coil conductors 21, 22, and is larger than the outer surfaces 21a, 22a of the first and second coil conductors 21, 22.

The material of the magnetic resin 40 is, for example, a resin material containing magnetic powder. The magnetic powder is, for example, a metal magnetic material such as Fe, Si, and Cr and the resin material is, for example, a resin material such as epoxy. For improvement of the characteristics of the coil component 1 (L-value and superposition characteristics), it is desirable to contain the magnetic powder at 90 wt % or more and, for improvement of a filling property of the magnetic resin 40, it is more desirable to mix two or three types of magnetic powder different in particle size distribution.

On the mounting surface 1a side of the magnetic resin 40, an external terminal 26 is disposed that is connected to a terminal of the mounting board 120. The external terminal 26 is connected via a lead wiring 25 to the second coil conductor 22. The lead wiring 25 is filled into a via hole 32a disposed in the second insulation resin 32 and a via hole 40a disposed in the magnetic resin 40. One side of the second coil conductor 22 connected to the lead wiring 25 is connected through a via hole 31a to the first coil conductor 21.

The external terminal 26 is made of a mixed material of resin and metal. The metal is made of, for example, Ag, Cu, and Au having small resistivity. The resin is made of, for example, phenol resin having a small Young's modulus. A surface of the external terminal 26 may be coated with Ni/Sn plating etc., so as to ensure wettability with solder.

A method of manufacturing the coil component 1 will be described.

Figure 4A:
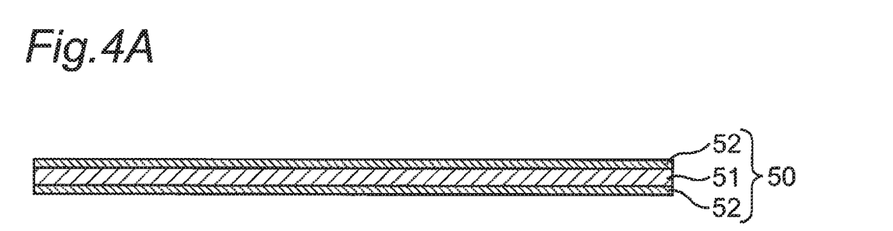
FIG. 4A is an explanatory view for explaining a first embodiment of a manufacturing method of the coil component of the present disclosure.

As shown in FIG. 4A, a base 50 is prepared. The base 50 has an insulation substrate 51 and base metal layers 52 disposed on both sides of the insulation substrate 51. In this embodiment, the insulation substrate 51 is a glass epoxy substrate and the base metal layers 52 are Cu foils.

Figure 4B:
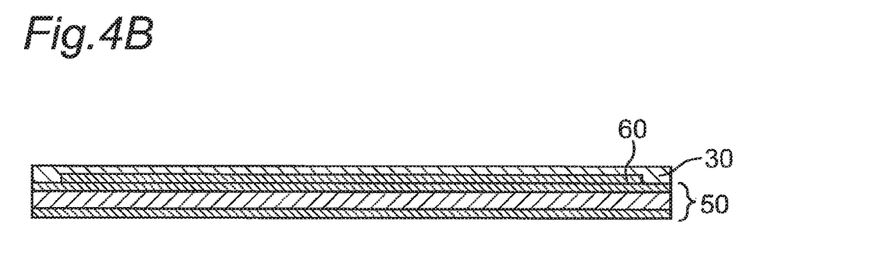
FIG. 4B is an explanatory view for explaining the first embodiment of the manufacturing method of the coil component of the present disclosure.

As shown in FIG. 4B, a dummy metal layer 60 is bonded onto a surface of the base 50. In this embodiment, the dummy metal layer 60 is a Cu foil. Since the dummy metal layer 60 is bonded to the base metal layer 52 of the base 50, the dummy metal layer 60 is bonded to a smooth surface of the base metal layer 52. Therefore, an adhesion force can be made weak between the dummy metal layer 60 and the base metal layer 52 and, at a subsequent step, the base 50 can easily be peeled from the dummy metal layer 60. Preferably, an adhesive bonding the base 50 and the dummy metal layer 60 is an adhesive with low tackiness. For weakening of the adhesion force between the base 50 and the dummy metal layer 60, it is desirable that the bonding surfaces of the base 50 and the dummy metal layer 60 are glossy surfaces.

Subsequently, the base insulation resin 30 is laminated on the dummy metal layer 60 temporarily bonded to the base 50. In this case, the base insulation resin 30 is laminated by a vacuum laminator and is then thermally cured.

Figure 4C:
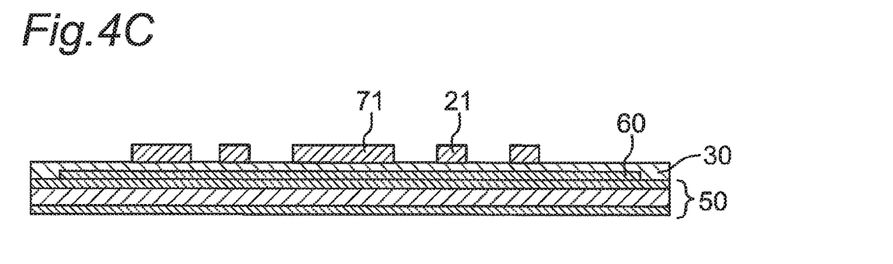
FIG. 4C is an explanatory view for explaining the first embodiment of the manufacturing method of the coil component of the present disclosure.

As shown in FIG. 4C, the first coil conductor 21 and a first sacrificial conductor 71 corresponding to the inner magnetic path are disposed on the base insulation resin 30. In this case, the first coil conductor 21 and the first sacrificial conductor 71 are formed at the same time by the semi-additive process.

Figure 4D:
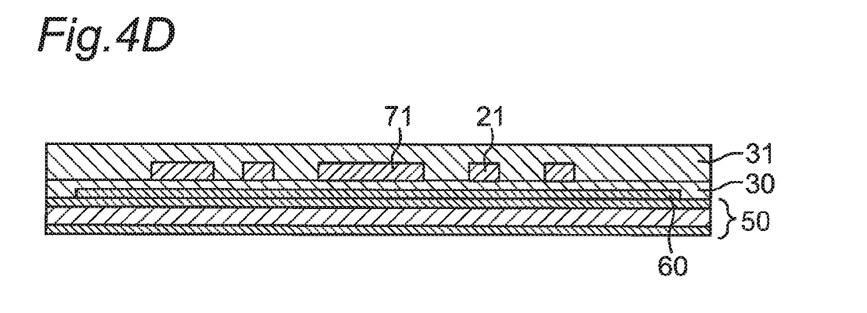
FIG. 4D is an explanatory view for explaining the first embodiment of the manufacturing method of the coil component of the present disclosure.

As shown in FIG. 4D, the first coil conductor 21 and the first sacrificial conductor 71 are covered with the first insulation resin 31. In this case, the first insulation resin 31 is laminated by a vacuum laminator and is then thermally cured.

Figure 4E:
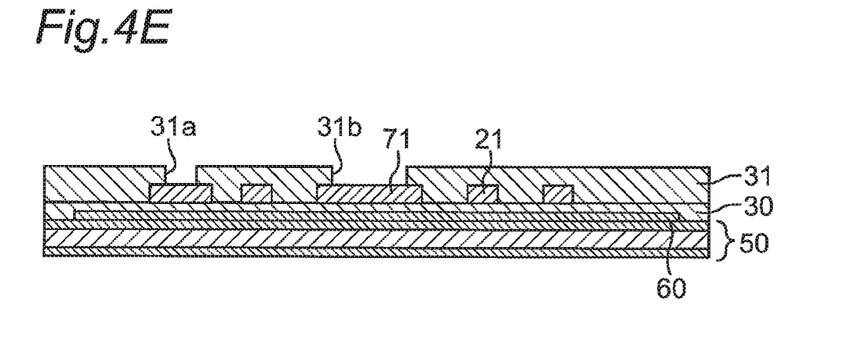
FIG. 4E is an explanatory view for explaining the first embodiment of the manufacturing method of the coil component of the present disclosure.

As shown in FIG. 4E, the via hole 31a is disposed in a portion of the first insulation resin 31 to expose the first coil conductor 21, and the opening portion 31b is disposed in a portion of the first insulation resin 31 to expose the first sacrificial conductor 71. The via hole 31a and the opening portion 31b are formed by laser machining.

Figure 4F:
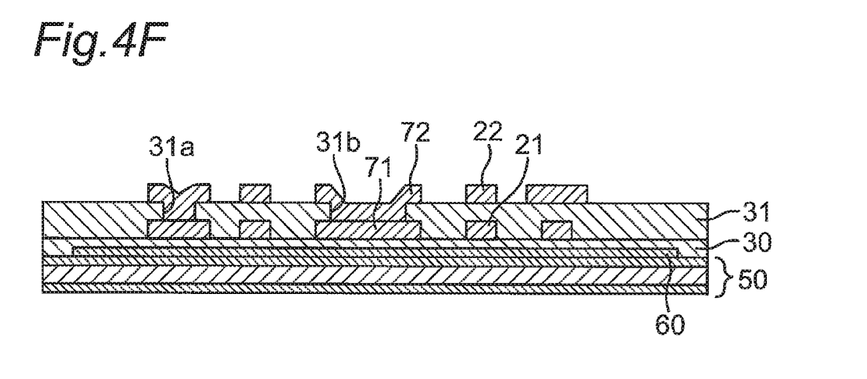
FIG. 4F is an explanatory view for explaining the first embodiment of the manufacturing method of the coil component of the present disclosure.

As shown in FIG. 4F, the second coil conductor 22 is disposed on the first insulation resin 31. The second coil conductor 22 is disposed in the via hole 31a of the first insulation resin 31 and is connected to the first coil conductor 21. A second sacrificial conductor 72 corresponding to the inner magnetic path is disposed on the first sacrificial conductor 71 in the opening portion 31b of the first insulation resin 31.

Figure 4G:
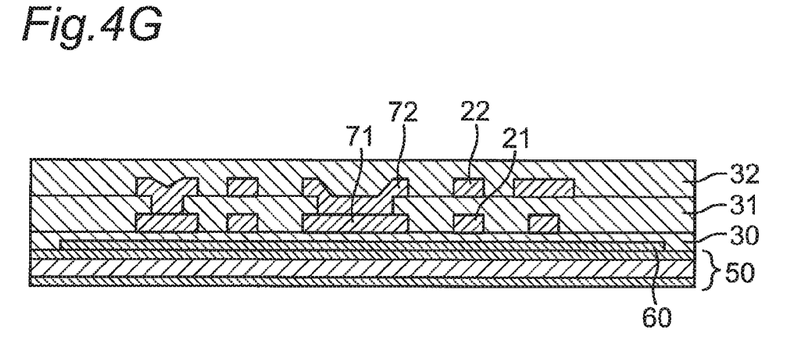
FIG. 4G is an explanatory view for explaining the first embodiment of the manufacturing method of the coil component of the present disclosure.

As shown in FIG. 4G, the second coil conductor 22 and the second sacrificial conductor 72 are covered with the second insulation resin 32.

Figure 4H:
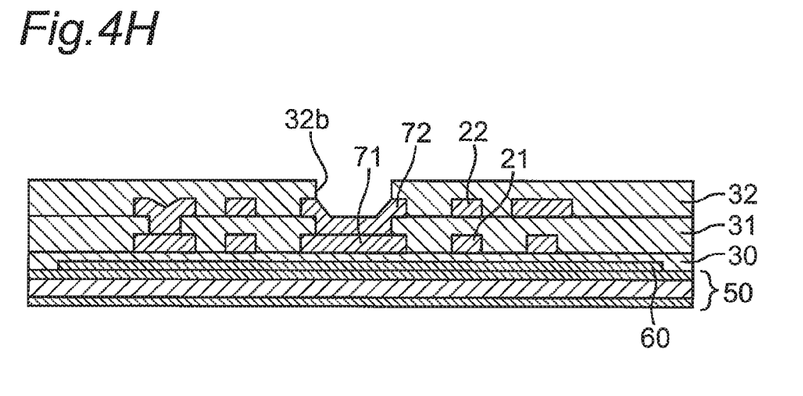
FIG. 4H is an explanatory view for explaining the first embodiment of the manufacturing method of the coil component of the present disclosure.

As shown in FIG. 4H, an opening portion 32b is disposed in a portion of the second insulation resin 32 to expose the second sacrificial conductor 72.

Figure 4I:
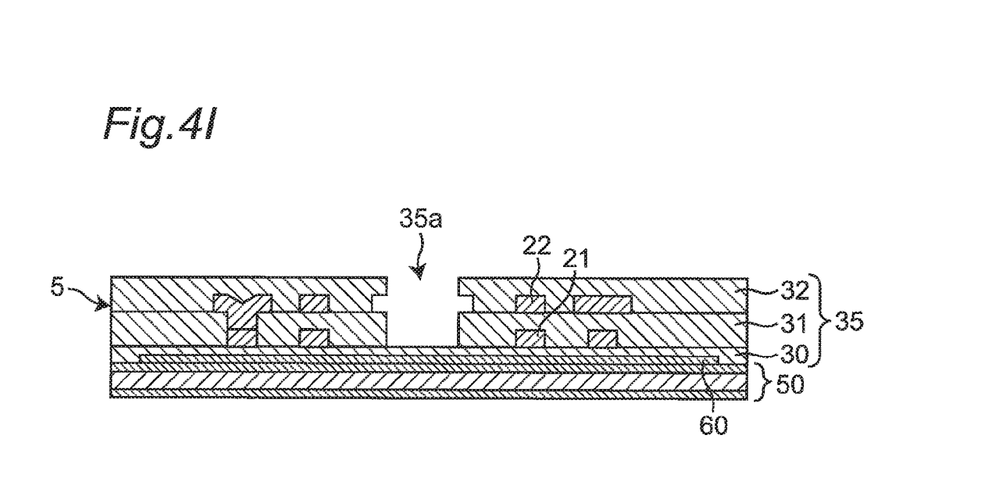
FIG. 4I is an explanatory view for explaining the first embodiment of the manufacturing method of the coil component of the present disclosure.

As shown in FIG. 4I, the first and second sacrificial conductors 71, 72 are removed and the concave portion 35a corresponding to the inner magnetic path is disposed in the insulation resin body 35 made up of the insulation resins 30 to 32. The first and second sacrificial conductors 71, 72 are removed by etching. The materials of the sacrificial conductors 71, 72 are, for example, the same material as the coil conductors 21, 22. In this way, the coil substrate 5 is formed of the coil conductors 21, 22 and the insulation resins 30 to 32.

Figure 4J:
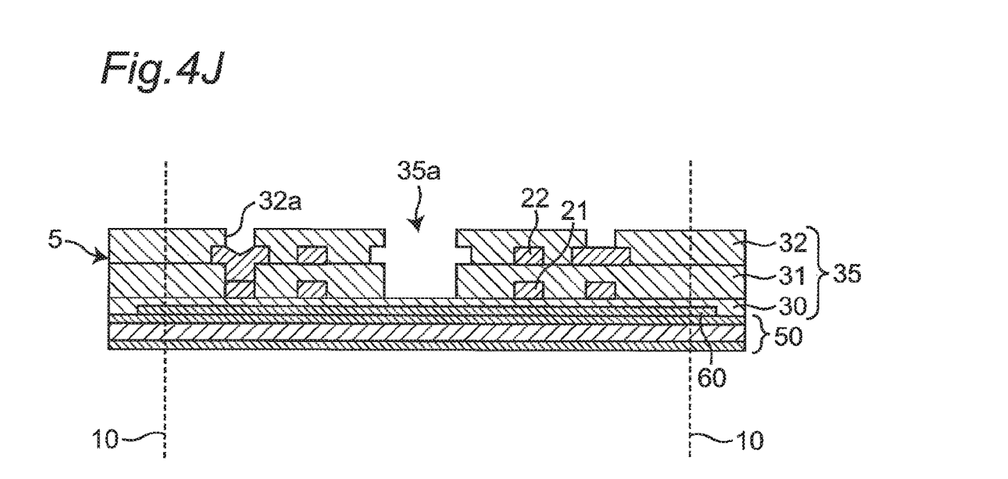
FIG. 4J is an explanatory view for explaining the first embodiment of the manufacturing method of the coil component of the present disclosure.

As shown in FIG. 4J, the via hole 32a is disposed in a portion of the second insulation resin 32 to expose the second coil conductor 22. An end portion of the coil substrate 5 is cut off along a cutline 10 together with an end portion of the base 50. The cutline 10 is located spaced inwardly from an end surface of the dummy metal layer 60.

Figure 4K:
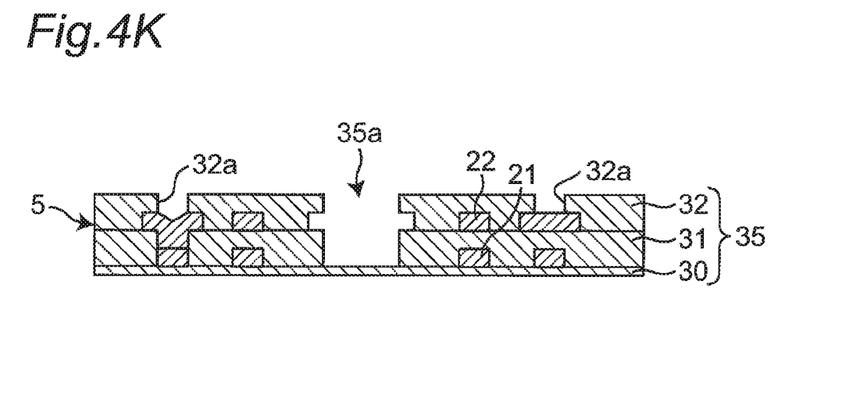
FIG. 4K is an explanatory view for explaining the first embodiment of the manufacturing method of the coil component of the present disclosure.

As shown in FIG. 4K, the base 50 is peeled off from the dummy metal layer 60 on the bonding plane between the surface of the base 50 (the base metal layer 52) and the dummy metal layer 60 and the dummy metal layer 60 is removed by etching.

Figure 4L:
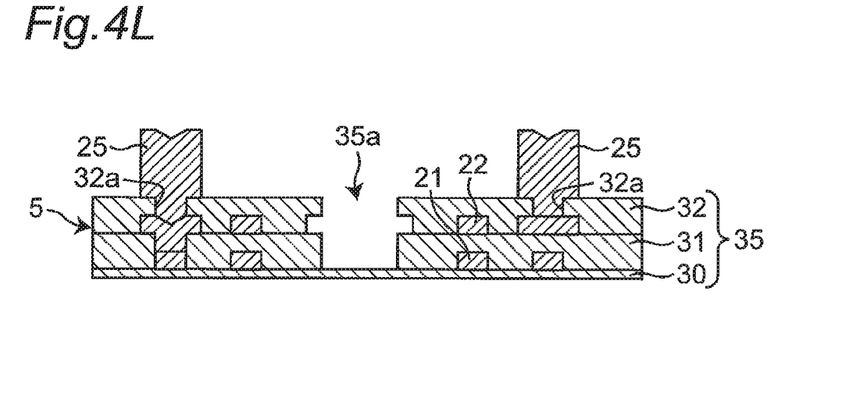
FIG. 4L is an explanatory view for explaining the first embodiment of the manufacturing method of the coil component of the present disclosure.

As shown in FIG. 4L, the lead wiring 25 is disposed in the via hole 32a of the second insulation resin 32 to connect the lead wiring 25 to the second coil conductor 22. The lead wiring 25 is formed by the semi-additive process.

Figure 4M:
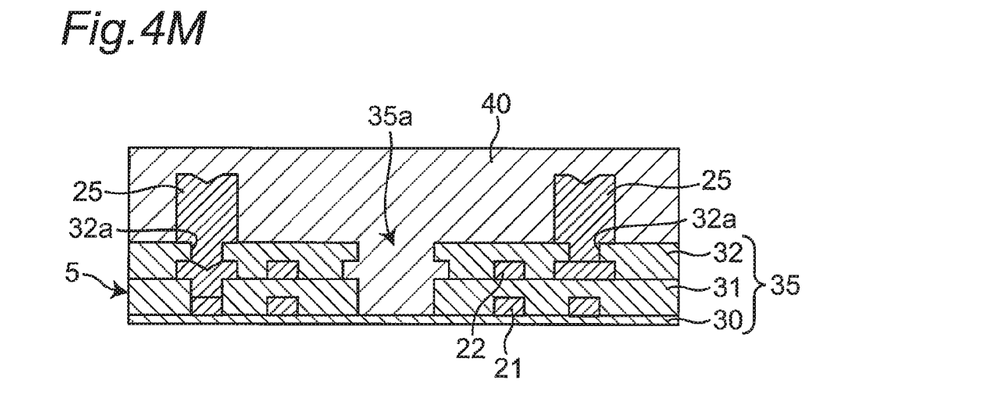
FIG. 4M is an explanatory view for explaining the first embodiment of the manufacturing method of the coil component of the present disclosure.

As shown in FIG. 4M, one surface of the coil substrate 5 on the second insulation resin 32 side is covered with the magnetic resin 40. In this case, a plurality of sheets of the shaped magnetic resin 40 is disposed on one side of the coil substrate 5 in the lamination direction, is heated and press-bonded by a vacuum laminator or a vacuum press machine, and is subsequently subjected to cure treatment. The magnetic resin 40 is filled into the concave portion 35a of the insulation resin body 35 to make up the inner magnetic path and is disposed on one surface of the insulation resin body 35 to make up the outer magnetic path.

Figure 4N:
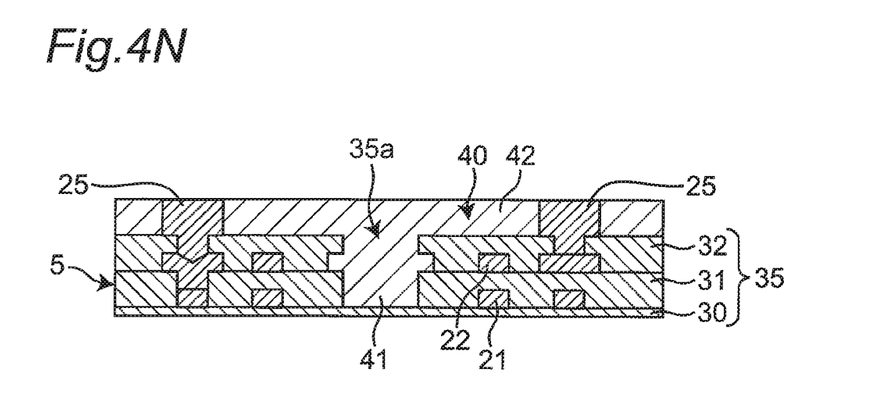
FIG. 4N is an explanatory view for explaining the first embodiment of the manufacturing method of the coil component of the present disclosure.

As shown in FIG. 4N, the magnetic resin 40 is subjected to grinding by a back grinder etc. to adjust chip thickness. In this case, an upper portion of the lead wiring 25 is exposed.

Figure 4O:
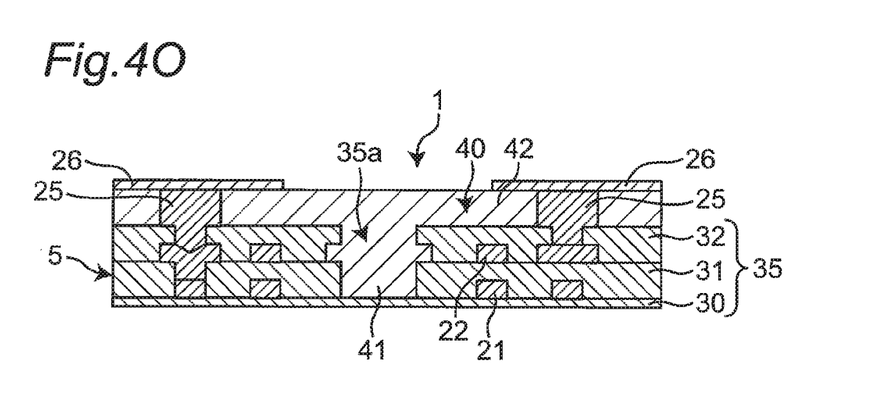
FIG. 4O is an explanatory view for explaining the first embodiment of the manufacturing method of the coil component of the present disclosure.

As shown in FIG. 4O, on one surface of the magnetic resin 40, the external terminal 26 is disposed and connected to the lead wiring 25. The external terminal 26 is formed by application of a resin electrode with dispersed metal microparticles by screen printing followed by dry-curing. Subsequently, after a dicer etc. are used for cutting into individual chips, a Ni/Sn plating coating film is formed on the external terminal 26 to acquire the coil component 1.

According to the coil component 1, since the magnetic resin 40 is disposed on the mounting surface 1a side of the coil conductors 21, 22, the magnetic resin 40 can suppress a magnetic flux leakage from the mounting surface 1a of the coil component 1. Therefore, when the mounting surface 1a of the coil component 1 is mounted on the mounting board 120, the magnetic flux leakage to the mounting board 120 side of the coil component 1 can be suppressed to acquire a desired inductance. Additionally, by suppressing the magnetic flux leakage to the mounting board 120 side of the coil component 1, the magnetic coupling to wiring and another electronic component disposed on the mounting board 120 can be suppressed to acquire a desired resonance operation. As a result, wiring and an electronic component can be arranged in the vicinity of the coil component 1 so as to achieve a reduction in size of the mounting board 120 on which the coil component 1 is mounted. Therefore, the thickness detection apparatus 100 can be reduced in size as a system including the coil component 1.

On the other hand, since the magnetic resin 40 is not disposed on the detecting surface 1b side of the coil conductors 21, 22, the magnetic resin 40 does not prevent the generation of the magnetic field from the detecting surface 1b of the coil component 1. Therefore, when the roller 150 acting as the detected conductor is placed on the detecting surface 1b of the coil component 1, the magnetic resin does not prevent the generation of the magnetic field to the roller 150 side of the coil component 1 and does not reduce the sensitivity of detection of distance from the roller 150 by the coil component 1.

According to the coil component 1, since the mounting surface 1a of the coil component 1 is mounted on the mounting board 120, the coil component 1 can be separated from the mounting board 120. Therefore, a failure of the coil component 1 can separately be selected to reduce a loss due to failure. When a plurality of the coil components 1 is used, the action described above enables the prevention of interference through wirings of the adjacent coil components 1 and the system can further be reduced in size.

According to the coil component 1, since the magnetic resin 40 is disposed on the inside of the inner surfaces 21b, 22b of the coil conductors 21, 22, this magnetic resin 40 makes up the inner magnetic paths of the coil conductors 21, 22. This enables an increase in density of the magnetic flux radiated from the coil component 1, an improvement in detection sensitivity of the coil component 1, and a reduction in size of the coil component 1.

According to the coil component 1, the magnetic resin 40 disposed on the mounting surface 1a side of the coil conductors 21, 22 covers the coil conductors 21, 22 when viewed in the axial direction of the coil conductors 21, 22, and is larger than the outer surfaces 21a, 22a of the coil conductors 21, 22. As a result, the magnetic flux leakage from the mounting surface 1a of the coil component 1 can further be suppressed.

Second Embodiment

Figure 5:
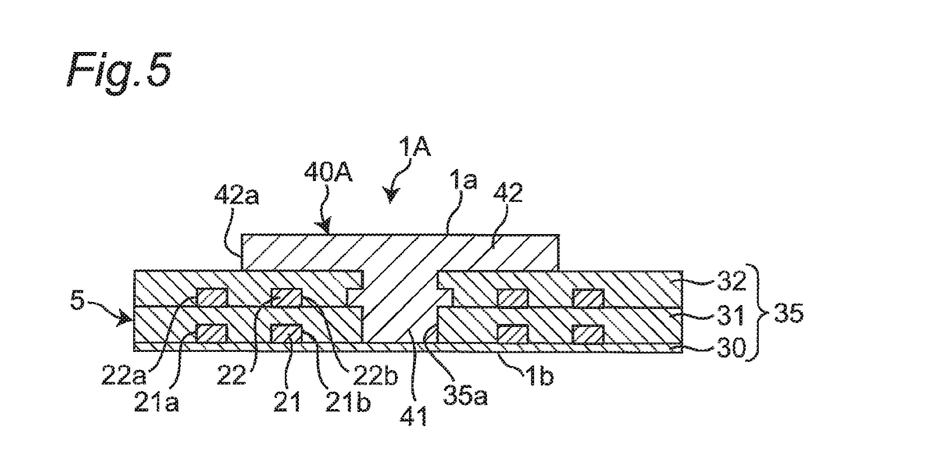
FIG. 5 is a cross-sectional view of a second embodiment of the coil component.

FIG. 5 is a cross-sectional view of a second embodiment of the coil component of the present disclosure. The second embodiment is different from the first embodiment in the configuration of the magnetic resin of the coil component. In the second embodiment, the same constituent elements as the first embodiment are denoted by the same reference numerals as the first embodiment and therefore will not be described.

As shown in FIG. 5, a magnetic resin 40A disposed on the mounting surface 1a side of the first and second coil conductors 21, 22 of a coil component 1A covers the inside of the inner surfaces 21b, 22b of the first and second coil conductors 21, 22 when viewed in the axial direction of the first and second coil conductors 21, 22 and is larger than the inner surfaces 21b, 22b of the first and second coil conductors 21, 22. Specifically, an outer surface 42a of the end portion 42 of the magnetic resin 40A is positioned between the outer surfaces 21a, 22a and the inner surfaces 21b, 22b of the first and second coil conductors 21, 22.

Therefore, the magnetic resin 40A disposed on the mounting surface 1a side of the first and second coil conductors 21, 22 is larger than at least the inner surfaces 21b, 22b of the first and second coil conductors 21, 22, and therefore can suppress the magnetic flux leakage from the mounting surface 1a of the coil component 1 while reducing the material of the magnetic resin 40A.

Third Embodiment

Figure 6:
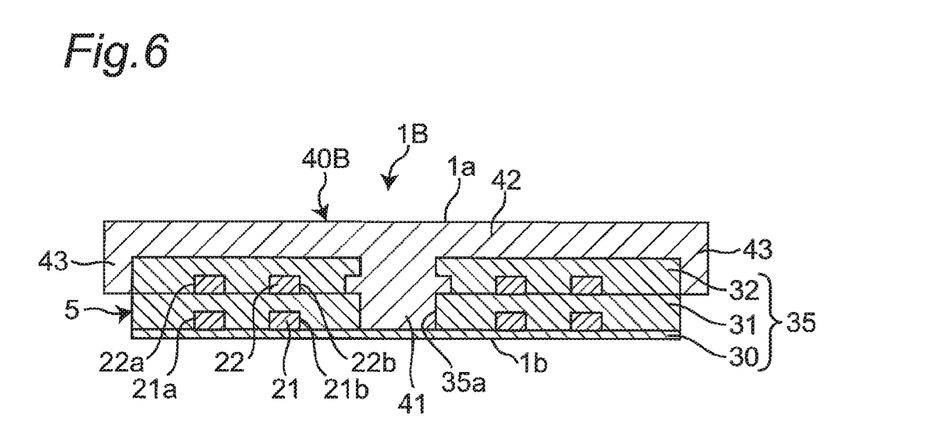
FIG. 6 is a cross-sectional view of a third embodiment of the coil component.

FIG. 6 is a cross-sectional view of a third embodiment of the coil component of the present disclosure. The third embodiment is different from the first embodiment in the configuration of the magnetic resin of the coil component. In the third embodiment, the same constituent elements as the first embodiment are denoted by the same reference numerals as the first embodiment and therefore will not be described.

As shown in FIG. 6, a magnetic resin 40B of a coil component 1B has a side portion 43 partially covering a side surface of the coil substrate 5. Therefore, the side portion 43 is positioned on the outside of the outer surfaces 21a, 22a of the first and second coil conductors 21, 22. The side portion 43 extends from an outer surface of the end portion 42 toward the detecting surface 1b.

Therefore, the magnetic resin 40B has the side portion 43 and therefore can guide the magnetic flux of the coil component 1 toward the detecting surface 1b and can suppress the magnetic flux leakage from the mounting surface 1a of the coil component 1.

The present disclosure is not limited to the embodiments and may be changed in design without departing from the spirit of the present disclosure. For example, respective feature points of the first to third embodiments may variously be combined.

Although the coil component is used for the thickness detection apparatus in the embodiments, the coil component may be used for any apparatuses detecting a distance from a detected conductor.

Although two layers of coil conductors are disposed as the coil component in the embodiments, one layer or three or more layers of the coil conductors may be disposed.

Although one coil conductor is disposed for each layer for the coil component in the embodiments, a plurality of coil conductors may be disposed for each layer.

Although the coil conductors of the coil component are formed into a plane spiral shape in the embodiments, the coil conductors may be formed into a cylindrical spiral shape.

Although the magnetic resin is disposed inside the inner surfaces of the coil conductors in the embodiments, the magnetic resin may not be disposed inside the inner surfaces of the coil conductors.

Although the coil substrate is formed on one of the both surfaces of the base in the embodiments, the coil substrates may respectively be formed on both surfaces of the base. As a result, higher productivity can be achieved.

The invention claimed is:

1. A coil component having a mounting surface that is a side mounted on a mounting board and a detecting surface that is a side generating a magnetic field to detect a distance from a detected conductor, comprising:
    a coil conductor formed into a spiral shape and disposed on a base insulating layer; and
    a magnetic resin disposed on the mounting surface side of the coil conductor while avoiding being disposed on the detecting surface side of the coil conductor such that the base insulating layer is exposed on the detecting surface.

2. The coil component according to claim 1, wherein the magnetic resin is disposed inside an inner surface of the coil conductor.

3. The coil component according to claim 1, wherein the magnetic resin disposed on the mounting surface side of the coil conductor covers an inside of the inner surface of the coil conductor when viewed in an axial direction of the coil conductor, and is larger than an inner surface of the coil conductor.

4. The coil component according to claim 3, wherein the magnetic resin disposed on the mounting surface side of the coil conductor covers the coil conductor when viewed in an axial direction of the coil conductor, and is larger than an outer surface of the coil conductor.

5. A coil component having a mounting surface that is a side mounted on a mounting board and a detecting surface that is a side generating a magnetic field to detect a distance from a detected conductor, comprising:
    a coil conductor formed into a spiral shape;
    a magnetic resin disposed on the mounting surface side of the coil conductor while avoiding being disposed on the detecting surface side of the coil conductor; and
    a first insulating layer and a second insulating layer disposed on the first insulating layer, wherein
    the coil conductor is disposed within both the first insulating layer and the second insulating layer, and
    the magnetic resin is disposed in a concave portion formed between the first insulating layer and the second insulating layer.

* * * * *